United States Patent [19]
Remillard

[11] Patent Number: 5,486,826
[45] Date of Patent: Jan. 23, 1996

[54] METHOD AND APPARATUS FOR ITERATIVE COMPRESSION OF DIGITAL DATA

[75] Inventor: John F. Remillard, Boulder, Colo.

[73] Assignee: PS Venture 1 LLC, Cheyenne, Wyo.

[21] Appl. No.: 246,014

[22] Filed: May 19, 1994

[51] Int. Cl.⁶ .................................................. H03M 7/30
[52] U.S. Cl. .............................................. 341/51; 341/75
[58] Field of Search ................................ 341/50, 51, 75

[56] References Cited

U.S. PATENT DOCUMENTS

| | | | |
|---|---|---|---|
| 3,984,626 | 10/1976 | Mounts et al. | 178/6 |
| 4,847,619 | 7/1989 | Kato et al. | 341/106 |
| 5,175,543 | 12/1992 | Lantz | 341/51 |
| 5,333,212 | 7/1994 | Ligtenberg | 382/56 |
| 5,363,096 | 11/1994 | Duhamel et al. | 341/50 |
| 5,392,362 | 2/1995 | Kimura et al. | 382/9 |

*Primary Examiner*—Marc S. Hoff
*Attorney, Agent, or Firm*—Townsend and Townsend and Crew; Kenneth R. Allen

[57] ABSTRACT

Data compression is effected on arbitrary high entropy digitized data by compression and entropy transformation in an iterative system. Compression includes nonlinear addressing. Entropy transformation may involve any of a number of techniques to reorder distribution of data for testing to determine if the newly ordered data is compressible. Among the techniques are a merge technique, a swapping technique and various arithmetic modification techniques.

20 Claims, 5 Drawing Sheets

METHOD AND APPARATUS FOR ITERATIVE COMPRESSION OF DIGITAL DATA

BACKGROUND OF THE INVENTION

This invention relates to the adjustment, i.e., increase or decrease, of the entropy (randomness) of digital information. More particularly, the invention relates to a method and apparatus which employs entropy adjustment in connection with the compression of randomized digital data, such as graphical images, video signals, digital datasets, including computer programs, databases and the like, whether or not a prior compression technique has been applied to the information.

Entropy is the measure of randomness of information. In the context of graphical images, entropy is a general measure of image "bumpiness"—the greater the bumpiness, the higher the entropy and the greater the amount of information that must be transmitted or stored. It is desirable to reduce the amount of information transmitted or stored, particularly image information, because spectrum and storage represent wasteful use of resources.

To understand how this "bumpiness" comes about in image data, consider a picture composed of just red and green "planes." If the red and green planes were each constant across the image, but of different levels, then in principle it would require only two numbers to specify the two (constant) levels. However, a combination plane that is derived from such an image would be composed of an interlaced checkerboard of constant red and constant green values, but with the red and green values at different levels. The combination image would thus have a strong component at a high spatial frequency, or high entropy.

In the past, it has been known to apply entropy reduction techniques to digital information in connection with data compression in order to minimize the information storage/transmission requirement. In the past, entropy has often been assumed to increase upon compression. Further study, however, shows that compression and entropy reduction techniques can be used together beneficially to optimize compression.

SUMMARY OF THE INVENTION

According to the invention, data compression is effected on arbitrary high entropy digitized data by compression and entropy transformation in an iterative system. Compression includes nonlinear addressing. Entropy transformation may involve any of a number of techniques to reorder distribution of data for testing to determine if the newly ordered data is compressible. Among the techniques are a merge technique, a swapping technique and various arithmetic modification techniques.

The invention will be better understood by reference to the following detailed description in connection with the following drawings.

DESCRIPTION OF SPECIFIC EMBODIMENTS

Figure 1:
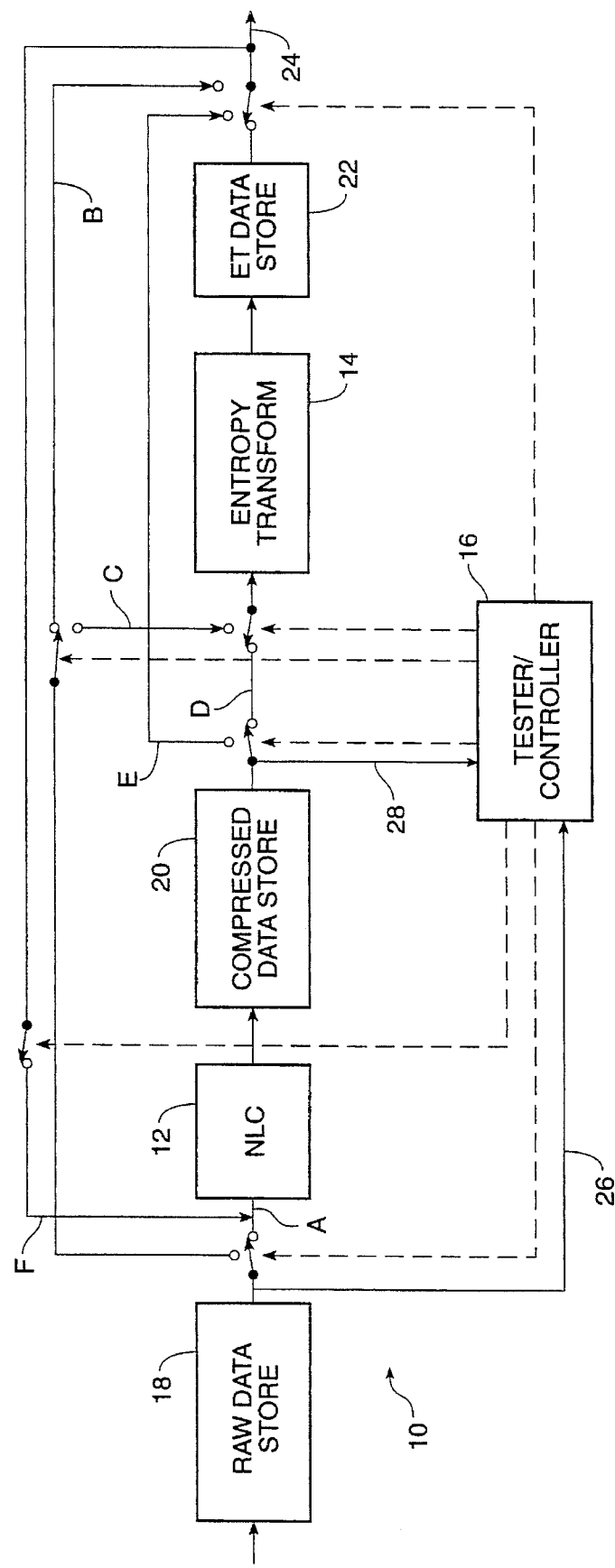
FIG. 1 is a block diagram of a digital data compressor according to the invention.

Referring to FIG. 1, a digital data compressor 10 comprises a nonlinear compression device 12 for compressing data by a nonlinear process, an entropy transformer 14 as hereinafter explained, a compression tester/controller 16 for checking compressibility of data and controlling the interconnection of elements, and data storage elements for storage of raw data 18, for storage of compressed data 20 and for storage of entropy-transformed data 22. The tester/controller 16 controls various signal routing switches to route raw data to the compressor 12 (path A), to the output 24 (path B) as a total bypass, or to the entropy transformer 14 (path C); to route the stored compressed data to the entropy transformer (path D) or to the output 24 (path E); and to provide an interuptable feedback signal path from the output of the entropy transformer 22 to the input of the nonlinear compressor 12 (path F).

The tester 16 receives raw data via input path 26 and receives processed data via input path 28 and may apply a series of tests. The tests determine whether compression has occurred on the processed data, and if compression has occurred, to what extent the reduction in the number of information bits (or sets of bits) has been offset by the increase in the number of data/control bits which indicate which information bits (sets) have been deleted and the amount of processing required to obtain the level of data compression. There is a tradeoff between raw ordered binary state information and a group digital code representing a large group of such raw binary information.

If data has been compressed and other tests suggest that further processing is appropriate, the tester/controller 16 allows the stored compressed data in compressed data store 20 to be applied to the entropy transformer 14, which performs one of several types of transformations to change distribution of the data set sequence. Uncompressed data, including raw data stored in the raw data store 18 may likewise be applied directly to the entropy transformer 14 (via path C), which in turn performs one of the several types of transformations to change distribution of the data set sequence. Various combinations of uncompressed and compressed data may be transformed by the entropy transformer 14 without departing from the spirit and scope of the invention.

If transformation is not desired for some reason, such as a previous entropy transformation has sufficiently optimized the data prior to compression, the entropy transformer 14 can be bypassed (via path E) and the data as otherwise processed can be made directly available at the output 24, in accordance with testing and control operation of the tester/controller 16.

It is contemplated that the compression and entropy transformations are part of an iterative process in which the output of the entropy transformer 14 stored in the third data store 22 is fed back to the nonlinear compressor 12 and compression, testing and transformation are iterated to a point of desired compression. As will be seen, entropy can always be reduced. However, entropy reduction results in an increased computation load and frequently an increased information storage load. It is intended that iterative entropy reduction will permit greater compression.

Figure 2:
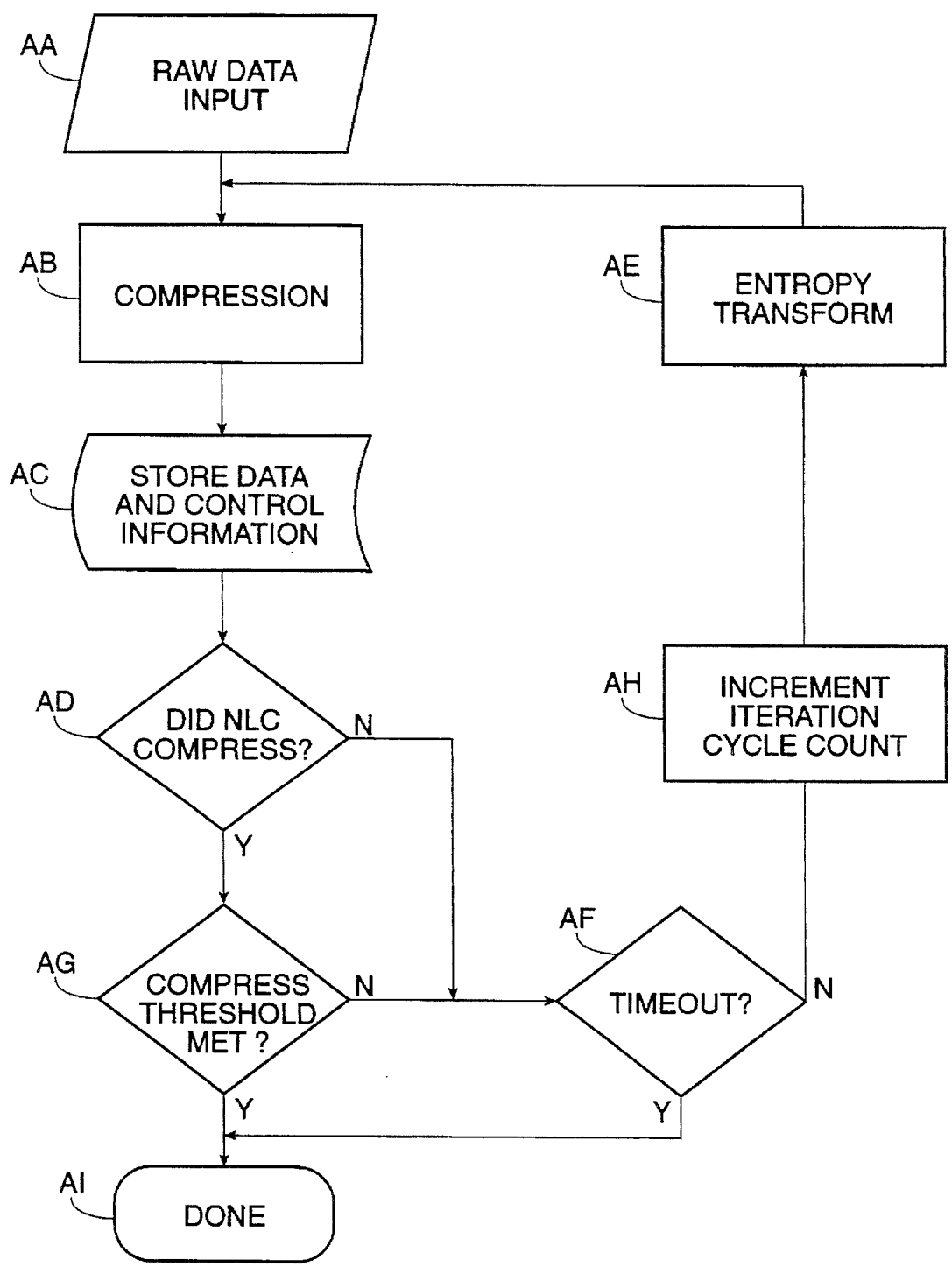
FIG. 2 is a flow chart of a method for digital data compression technique according to the invention.

FIG. 2 is a flow chart of the iterative process according to the invention. Raw data is initially input from a source, such as a digital image device, a digital communications line, a digital data mass storage device or the like (Step AA). The nonlinear compression technique is then applied to the raw data (Step AB), the results of the nonlinear compression (nlc) forming a set for testing. (In the limit, the generalized nonlinear compression technique includes linear compression techniques, as hereinafter shown.) The resultant data and control information, e.g., information bit sets and control/data set, is stored in the second data store (Step AC), and a first test is performed to determine by comparison with indices on the input data whether the nlc technique actually resulted in compression (Step AD). If it did not, the entropy transform is applied (Step AE) after the iteration counter is incremented (Step AH), and the nlc technique step is repeated (Step AB). A timeout test (Step AF) assures that the iterative process is not infinite. If the nonlinear compression technique causes compression, the amount of compression is tested against a threshold (Step AG). If it is not met, entropy transformation (Step AE) is again applied after incrementing the iteration cycle count (Step AH), subject to the timeout (Step AF). Once the compression threshold is met or the timeout has run, the process is considered completed (Step AI), and the stored data is made available for transmission or for storage for future use. Reconstruction of the original raw data is a relatively trivial exercise, since it is essentially a reverse process, and all since the entropy reduction is lossless.

Figure 3:
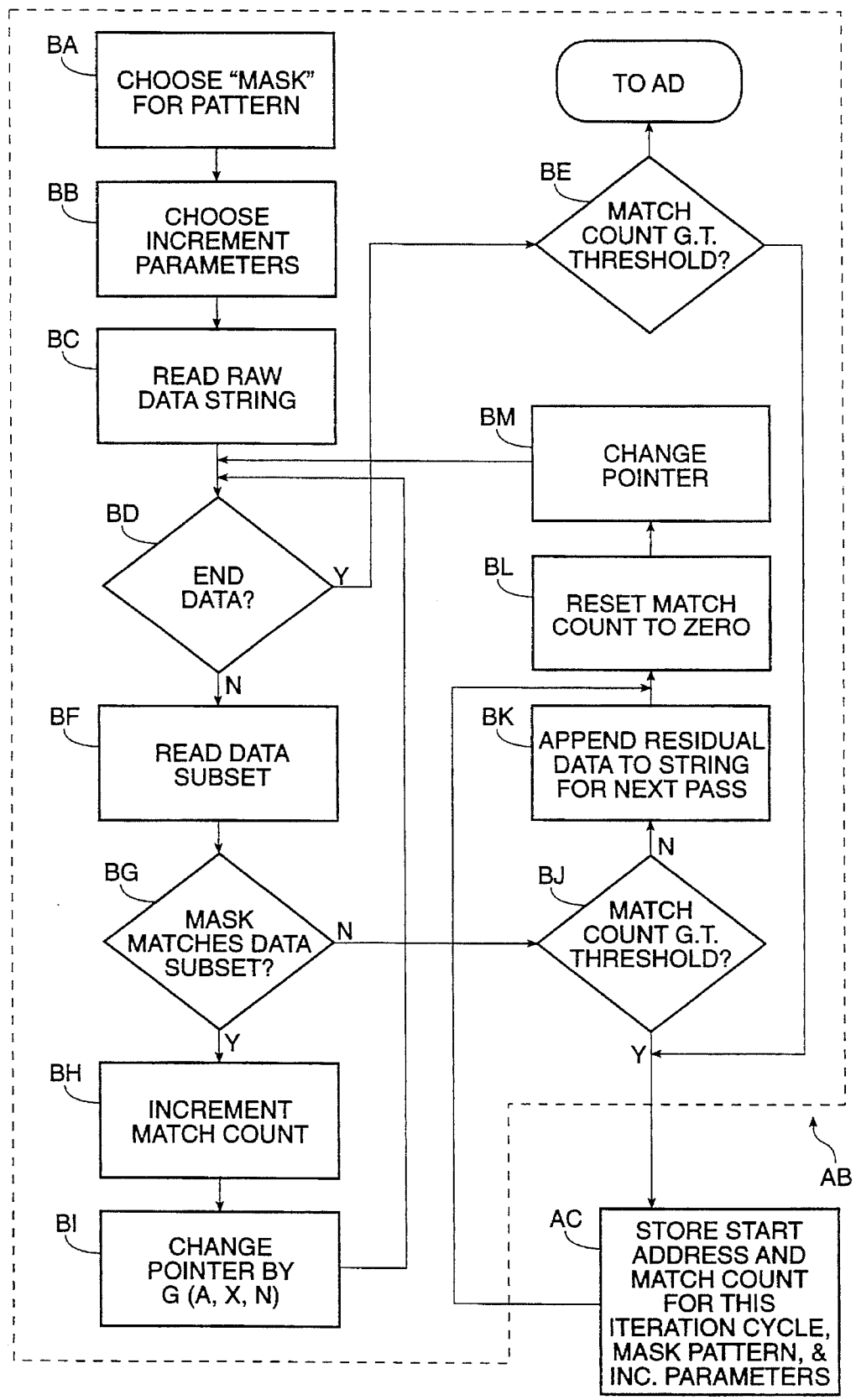
FIG. 3 is a flow chart of a compression method used in connection with the invention.

FIG. 3 is a flow chart of the preferred method of compression in accordance with the invention. Compression, is in general an iterative nonlinear process, and in a specific case is a linear process. This form of compression involves the searching for a pattern based on rules, then substituting a representative value with an index to the location (and iteration index) in the run length string. Various patterns are contemplated, such as identical consecutive values (bits) in a run length of bits, or identical values in every other position in a run length, or a pattern of bits matching a mask, or a pattern of differences between values representing a mask. Because of the typically large search space for such patterns, a search index is provided according to the invention which can cover the entire search space in a pseudo-random sequence, that is, a sequence which is computable but which is not repeated during the run length analysis.

Referring to FIG. 3, there is shown a flow chart of the compression technique in accordance with the invention, namely, step AB of FIG. 2. In the nlc compression process, there is a "mask" established representing the pattern to be searched for (Step BA). It may be a single bit or a static mask of strings of a plurality of bits, or it may be a computation on a string of bits. An example is a mask for the pattern 01010101. A second example is a varying mask which changes according to a rule or pattern with each iteration of a scan within the compression process. The increment parameters may then be set (Step BB). The increment parameters may be embedded in a function whose output is the value y truncated to an integer as determined by a calculation such as preferably $y=ax^n$, where y is the value of the pointer position (truncated to an integer), a, x and n may be integer or noninteger variables, each of which may have an initial value for a series of passes and a differential value for each pass. The function $y=ax^n$ degenerates to a linear function under a limited variety of conditions, e.g., typically, where n=1, but also for n=0, or x=1.

Having established the increment parameters, a raw (input) data string is read (Step BC). For the purposes of checking for the end of the string, it is necessary to include an end of data test (Step BD), which when satisfied, causes the process to conclude with a test for a match count against a threshold (Step BE), and either repeat the Store step (Step AC) or advance to the next major step (Step AD).

If not at the end of data, the data subset, or string to be tested, is read (Step BF), and the data subset is tested against the mask, which is static or dynamic, as previously defined (Step BG). A match with the mask is indicative of a potential for data compression, so the match counter is incremented (Step BH) and the pointer is changed (according to the nonlinear process, for example) (Step BI), and the scan is continued (at Step BD).

The match counter is an indication of the number of consecutive matches to the mask found along the (nonlinear) path of the pointer through the data subset. Once the end of the consecutive matches is found (Step BG), the count is tested against a threshold (Step BJ). It is assumed that a minimum number of consecutive matches to the mask is needed before a value is substituted for the "string" of matches. If the count is insufficient, the residue of the data, namely, the "short" string, is appended to other "short" string data (Step BK) for use in the next pass and potentially in the next iteration following entropy reduction. The match count is set to zero (Step BL), the pointer is changed according to the (nonlinear) pointer function (Step BM). The process repeats from step BD until the match count exceeds the preselected threshold (Step BJ), at which time the compression process is terminated and the start address and match count for this iteration cycle are stored for the current iteration cycle, mask pattern and incrementation parameters of the pointer function (Step AC).

The pointer function may take on a variety of forms. In a specific embodiment, the pointer function may have dithering superimposed on the base function, such as in the form:

$$y=a*x^n \pm b* \sin (nx) \pm c* \cos (nx).$$

This form is exemplary of the combination of nonlinear functions (for positive values) weighted by transcendental functions which oscillate. If the weighting b and c are sufficiently small, the additional terms constitute a dithering factor, and the oscillations are merely a dithering about the values of $ax^n$.

The entropy transformation process is according to the invention a reordering of positions of data in a dataset by a process which is reversible, thereby achieving lower entropy by introducing an ordering. In the preferred embodiment, there is a reversible cutting and recombining of data within a subset of data. In this particular embodiment, the transformation occurs only once before the resultant pattern is compressed and tested for combinations. However there is a limitation on the number of iterations. The permutations of which are limited only by the length of the subset of data. For a data string of n=128 bits, the number of permutations is $2^{128}$ combinations. While many of the permutations are compressible, there are many permutations which are not compressible without loss using known techniques. It is an object of the invention to build permutations of the data which are compressible, so that compression can be optimized.

A variety of cutting and recombination processes may be used to reconstruct the dataset string. Each iteration introduces order, thus decreasing entropy. Some of the possible transformations are the "merge," the "swap," and an arithmetic modification or transformation.

A merge is a cut and recombine operation. An example of a merge is a "shuffle" which is analogous to an ordered cut and an ordered shuffling of a deck of playing cards, where the card positions are tracked. In a shuffle, the dataset is functionally divided into at least two not necessarily equal-sized subsets (using dual or multiple pointers), and then the datasets are recombined in a new dataset order by combining data points addressed by the pointers in alternating order according to a function operative on the pointers. The shuffle can be generalized to any number of source stacks less than the number of data points in the dataset and any number of pointers less than the number of data points in the dataset. At the maximum number, the merge is generalized to the set of all possible permutations of the dataset.

A swap is an exchange of paired data between selected data points in the dataset. A standard swap procedure requires no marker as to the location of particular data points, so long as the type of swap has been defined and it is included in the library of functions associated with the system. Thus, a data value can be tracked by tracing the swap pattern, both in forward and in reverse (to the point at which the data originated). It should be understood that it is possible to construct and analyze a transformation without actually performing the transformation, from knowledge of the data, so long as it is not necessary to store the specific transformation, if there is a library of transformations which can be used to execute the transformations. The library is tested and referenced in the process of selection of the reconstruction type (Step CA FIG. 4, as described below).

A form of arithmetic modification according to the invention is herein termed the "origami" transformation. The name is derived from a process of "folding" two values around a third value or set of values. An origami transformation is an arithmetic additive differencing process from which the difference between values at two data points become a new value which is relocated on the number line of the three values. The arithmetic transformation operator is subtraction. The purpose is to make the differences between any two of the values as small as possible and eventually zero, so that one of the values can be deleted as a duplicate. The process is iterative. Eventually, the difference value between two members of the transformed data set equals the value of another member of the dataset (in the calculation), at which point a marker is made indicating that one dataset element is duplicated and can be eliminated. A set of markers is built to track the order of the recombination and the fact of a deletion at a particular iteration. The markers in fact form a second set of data, which itself exhibits an order. So that the size of the ordered marker set does not build up so quickly as to exceed the size of the dataset, the word size of the values in the dataset is selected to be large, typically a word size of at least 128 bits and preferably over three thousand bit word size. As differences are reduced, the higher order bits become zero and can be deleted without loss of information. Hence, compression is effected. Thus, the origami transformation is itself a form of lossless compression.

Another form of arithmetic modification is called "highest common rooting." In this transformation, similar to the differencing method of "origami," a highest common root is sought out between two or more values. The arithmetic transformation is the exponential to the $n^{th}$ root, where n is one of the values. Thus the arithmetic operator is an exponentiation.

In this technique, the highest common root is a positive rational number, but not necessarily an integer, preferably with a limited number of significant places, so that origin numbers can be reconstructed without loss of accuracy. It is also iterative and a form which lends itself to compression. A large word-sized binary arithmetic unit is helpful to perform this calculation, or a large base-number sized arithmetic unit (base 256 arithmetic for example), neither of which is found in even supercomputers. However, the arithmetic units have been simulated in software and the operations have been verified as being functional.

Another form of arithmetic modification which lends itself to compression is the "highest common denominator" transformation. As its name indicates, the transformation is a multiplicative differencing method based on seeking out the highest common denominator, i.e., the transformation operator is a division or multiplicative differencing. Similarly, a large arithmetic unit is helpful.

There are other types of entropy transformations which could be employed, so long as loss is prevented and order is preserved so that the process is reversible. A discussion of all entropy transformation techniques is beyond the scope of this invention.

Figure 4:
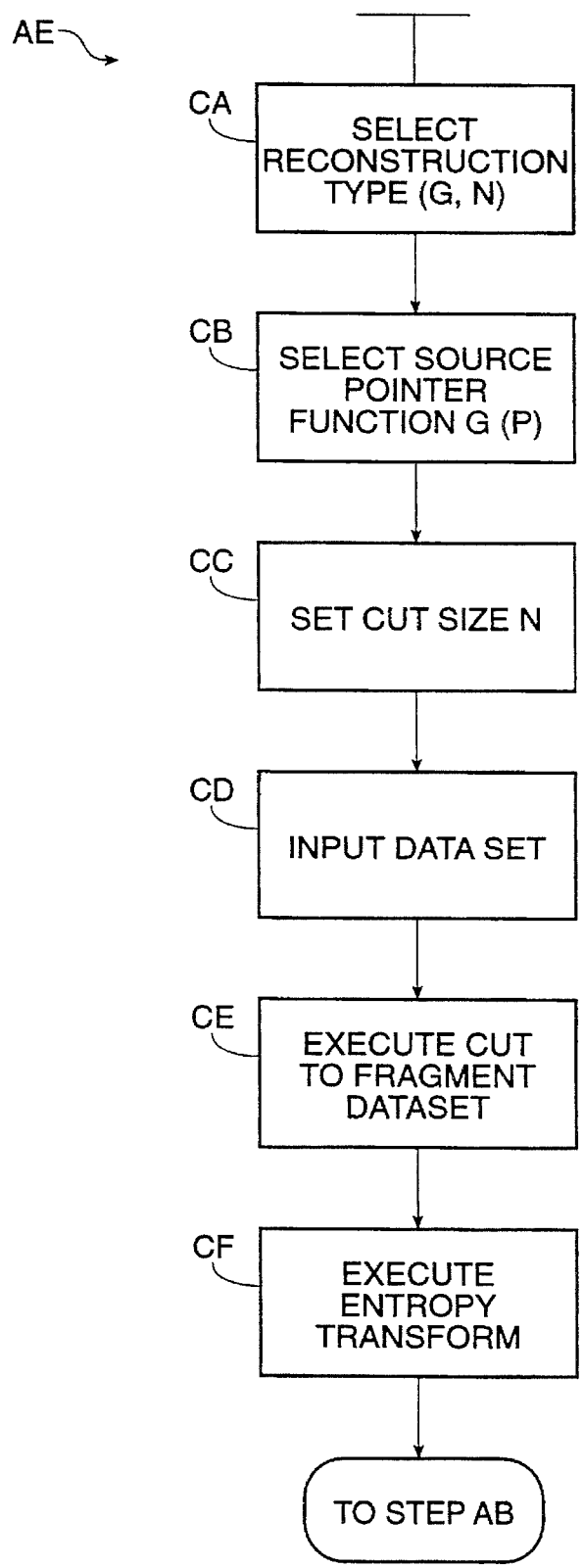
FIG. 4 is a flow chart of entropy transformation according to the invention.

FIG. 4 is a flow chart of entropy transformation according to the invention (Step AE). First, the reconstruction type is selected (Step CA). The reconstruction type must be a reversible process, so that the data can ultimately be recovered without loss. Reconstruction type refers to basic two-way mapping between the positions of data elements of subsets of data in a source dataset and in a target dataset. The definition may include a set of destination pointers which are data independent and a set of the number of segments or cuts to be processed. A minimum number of segments is two and a maximum is the number of data elements in the source dataset. If the maximum number is selected, there will result a total reordering of data elements from "exploded" data. The source pointer function is selected for processing source information (Step CB). It is a set of source pointers based on any reversible ordering, which must be different from the destination pointers (otherwise there will be no transformation). The source cut size is set after the number of source cuts has been set (Step CC). The source cut size is generally some odd fraction of the total dataset size, although one-half would produce two equal-sized subsets for a cuts=2 transformation.

The dataset is then input (Step CD), and according to the invention, the data is then cut according to the source cut size (Step CE) to fragment the dataset, and then according to the invention, the selected entropy transform is executed Step CF), which in the case of a merge, as explained below is a process wherein the data subsets are reassembled according to the destination pointer-based reconstruction to form a transformed dataset. In the case of arithmetic modification, as explained below, the entropy transform is an operator-based computation. The transformed dataset is then applied to the compression processor to search for further patterns (Step AB, FIG. 2).

An example of a merge for cuts=2, with data {10100101} initially split to form two data subsets {1010_} and {_0101} (a dataset of 8 positions) with fixed position 0, fixed position 7, produces at most a set of 26 permutations to be tested for data compression.

Figure 5:
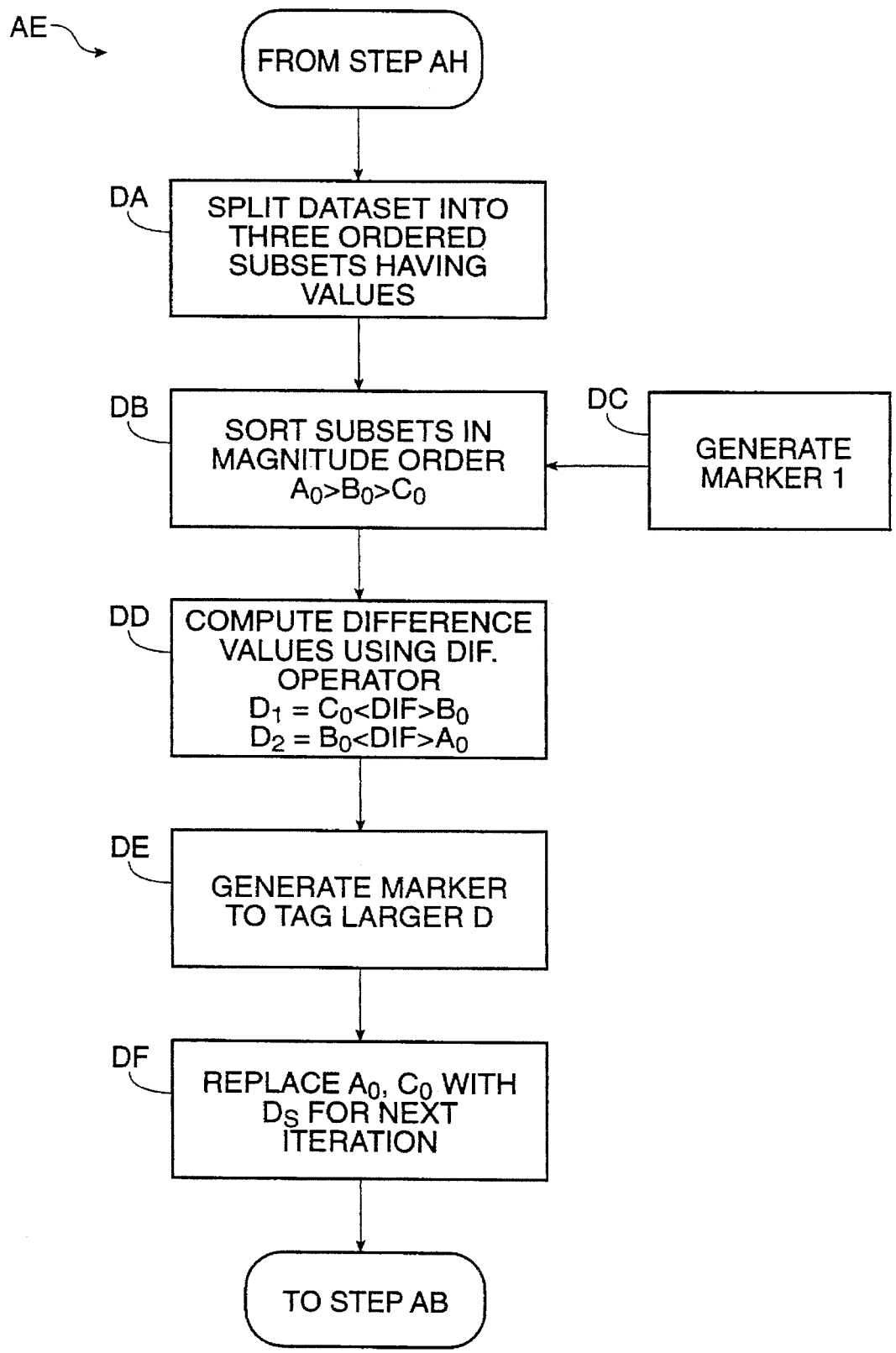
FIG. 5 is a flow chart of an arithmetic modification-type entropy transformation according to the invention.

FIG. 5 is a flow chart describing arithmetic modification forms of entropy transformation. The dataset is divided into three subsets, each of which can be viewed as a magnitude value (Step DA). The subsets are then sorted in ascending magnitude order as $A_0$, $B_0$ and $C_0$ (Step DB) and a marker is generated (and stored) to be used to recover the original order (Step DC). Thereafter, according to the invention, difference values are computed using a difference operator (DIF) as previously explained, namely, the subtraction operator or the division operator or the root operator to produce two difference values relative to the intermediate value $B_0$ (Step DD). Then a second marker is generated to tag the larger of the two differences so the original order can be recovered (Step DE). Then the values $A_0$ and $C_0$ are replaced by the two difference values for the next iteration (Step DF), and the process proceeds to the compression step (Step AB). As will work out in the compression processor, one of the three subsets will duplicate another one of the subsets, as the subsets converge. If the convergence is toward a value of zero difference, any leading zeroes in the reordered dataset can be discarded, resulting in an order of magnitude (base 2) compression of the remaining data. Similarly, if convergence is to a specific pattern (e.g., for the pattern whose value is $B_0$, that pattern can be replaced by a symbol or operator representing that pattern.

The invention has been explained with reference to specific embodiments. Other embodiments will be apparent to those of ordinary skill in the art. It is therefore not intended that this invention be limited except as indicated by the appended claims.

What is claimed is:

1. A method for compressing digitized information comprising the steps of:
    a) storing input digital information in a first storage means;
    b) applying a compression process in a compressor means to the stored input digital information to obtain first information bit sets and a first control/data set about the first information bit sets, said first information bit sets intended to be a reduced number of information bit sets compared to said input digital information, and storing said first information bit sets and said first control/data set in a second storage means as first processed data; thereafter
    c) testing said first processed data in comparison to said input digital information to determine if total information storage requirements have been reduced; and if so
    d) testing said first processed data against a compression threshold; and, if the compression threshold is not met,
    e) applying an entropy transformation on said first processed data to obtain transformed data; thereupon
    f) storing as output information at least said transformed data in a third storage means as a representation of processed information;
    g) repeating step b) with said representation of processed information as said stored input digital information; and
    h) repeating steps c) through g) until no further compression is desired.

2. The method according to claim 1, wherein said entropy transformation step comprises:
    selecting an entropy transform as a data reconstruction type;
    setting a cut size; thereafter, acting upon said first processed data;
    executing a cut of data subsets; and thereafter executing the entropy transform.

3. The method according to claim 2, wherein said entropy transform is a merge function employing a pointer-based reconstruction based on a source pointer function.

4. The method according to claim 2, wherein said entropy transform selection step further comprises:
    testing said first processed data to identify potentially connected set information, and then testing the potentially connected set information against a library of transformations.

5. The method according to claim 2, wherein said entropy transformation comprises:
    performing, as said entropy transform step, a merge of at least two subsets of said first processed data.

6. The method according to claim 2, wherein said entropy transformation step comprises:
    performing, as said entropy transform step, a swap of positions within said first processed data.

7. The method according to claim 6, wherein said cut has been set to one half of the total dataset size.

8. The method according to claim 2, wherein said entropy transformation step comprises:
    performing, as said entropy transform step, an arithmetic modification on at least two values defining subsets of said compressed data.

9. The method according to claim 2, wherein said entropy transformation step comprises:
    performing, as said entropy transform step, an arithmetic modification on at least one value defining a subset of said compressed data.

10. The method according to claim 8 wherein said arithmetic modification includes an additive differencing operation.

11. The method according to claim 8 wherein said arithmetic modification includes a multiplicative differencing operation.

12. The method according to claim 8 wherein said arithmetic modification includes an exponential rooting operation.

13. The method according to claim 1, wherein said compression step comprises:
    testing said first processed data to extract connected set information.

14. The method according to claim 1, wherein said compression process comprises the steps of:
    a) establishing a scan pattern;
    b) establishing a scan sequence;
    c) testing the data subset for a match with the scan pattern; if a match is found,
    d) incrementing a match counter value and changing a pointer to the data subset according to the scan sequence and repeating steps c) and d); once no such match is found,
    e) testing the match counter value against a threshold value; if the threshold value is exceeded,
    f) storing at least start address of said pointer and the match counter value for a current compression pass;
    g) reset the match counter value to zero and change the pointer;
    h) repeating beginning with step c), and if the threshold value is not exceeded, appending residual pattern data to a string for a next pass, said residual pattern data being data having no match with said pattern; and
    repeating beginning with step g).

15. The compression method according to claim 14 wherein said incrementing step uses an index which is a nonlinear iteration.

16. The compression step according to claim 15 wherein said index is based on a solution to the equation: $y = ax^n$, where all values are greater than zero, y is the index and at least one of said a, x and n is a variable.

17. The compression step according to claim 16 wherein said index includes a dithering factor.

18. An apparatus for compressing digitized information comprising:
    first storage means for storing input digital information;
    a compressor means coupled to said first storage means for producing first processed data;
    a second storage means coupled to said first storage means for storing said first processed data;
    testing and control means for testing said first processed information for compressibility and for compression relative to a compression threshold;
    an entropy transformation means coupled to input digital information and processed data to obtain transformed data;
    third storage means for storing as output information at least said transformed data as a representation of processed information; and feedback means for feeding back said transformed data to said compressor means for iterative processing.

19. The apparatus according to claim 18 wherein said compressor means is operative to substitute an operation represented by a symbol for a pattern of data.

20. The apparatus according to claim 19 wherein said entropy transformation means comprises means for merging two subsets of data using Pointer-based reconstruction.

* * * * *